United States Patent [19]

Yano

[11] Patent Number: 4,809,277

[45] Date of Patent: Feb. 28, 1989

[54] CONVOLUTIONAL ENCODER

[75] Inventor: Mitsuharu Yano, Tokyo, Japan

[73] Assignee: NEC Corporation, Tokyo, Japan

[21] Appl. No.: 106,681

[22] Filed: Oct. 13, 1987

[30] Foreign Application Priority Data

Oct. 14, 1986 [JP] Japan .................. 61-242036

[51] Int. Cl.$^4$ ........................... G06F 11/10
[52] U.S. Cl. ..................................... 371/43
[58] Field of Search ............. 371/43, 44, 45, 46

[56] References Cited

U.S. PATENT DOCUMENTS

| | | | |
|---|---|---|---|
| 4,669,084 | 5/1987 | Hartman et al. | 371/43 |
| 4,682,343 | 7/1987 | Pfiffner | 371/43 |
| 4,700,349 | 10/1987 | Gallager | 371/43 |
| 4,761,784 | 8/1988 | Srinivasagopalan et al. | 371/43 |

OTHER PUBLICATIONS

IEEE Transactions on Information Theory, vol. 23, No. 5, 1977, pp. 615–618, Hagenaver, "High Rate Convolutional Codes with Good Distance Profiles".

Sixth International Conference on Digital Satellite Communications, Session 12, pp. 24–31, "Development of Variable-Rate Viterbi Decoder and its Performance Characteristics", 1983.

*Primary Examiner*—David H. Malzahn
*Attorney, Agent, or Firm*—Foley & Lardner, Schwartz, Jeffery, Schwaab, Mack, Blumenthal & Evans

[57] ABSTRACT

An encoding apparatus comprises a converter and a convolutional encoder. The converter translates a k-bit input to an m-bit output, where m is smaller than k, and the k-bit input belongs to one of $2^m$ subsets of a set of $2^k$ elements, the m-bit output representing the subset to which the k-bit inputs belong. Each of the subsets has $2^{k-m}$ elements and the minimum Hamming distance between any of the $2^{k-m}$ elements is equal to or greater than the Hamming distance to be achieved by the encoder. The convolutional encoder is responsive to the k-bit input and the m-bit output of the converter to generate an (n−k)-bit output, where n is greater than k.

2 Claims, 2 Drawing Sheets

CONVOLUTIONAL ENCODER

BACKGROUND OF THE INVENTION

The present invention relates to a convolutional encoder, particularly to such an encoder having a high code rate efficiency.

Convolutional code rate efficiency can be improved without decreasing their minimum Hamming distance. This is achieved by increasing the constraint length of the convolutional codes. IEEE Transactions on Information Theory, Vol. 23 No. 5, 1977, pages 615 to 618 describes a convolutional encoding technique for such purposes with a minimum Hamming distance of 4, a code rate ⅞ and a constraint length 56.

Punctured convolutional encoding is known as a high code rate efficiency technique. With this technique, a ⅞ convolutional encoder having a minimum Hamming distance of 3 and 64 states is described in Sixth International Conference on Digitlal Satellite Communications, Session 12, pages 24 to 31.

However, the number of sates that a convolutional encocer assumes increases exponentially as a function of the constraint length ofthe encoder and for this reason it is impractical for decoding large constraint length codes using Viterbi decoding algorithm which is known as a maximum likelihood decoding method. Convolutional codes having a large constraint length are undesirable since relatively large delays are introduced to decoding process.

SUMMARY OF THE INVENTION

It is therefore an object of the present invention to provide a convolutional encoding technique which ensures high coding rate, large minimum Hamming distance without increasing the number of encoder states. The convolutional encoder of the invention advantageously allows the use of Viterbi decoders having a powerful error correcting capability.

According to the present invention, an encoding apparatus comprises a converter and a covolutional encoder The converter translates a k-bit input to an m-bit output, where m is smaller than k, and the k-bit input belongs to one of $2^m$ subsets of a set of $2^k$ elements, the m-bit output representing the subset to which the k-bit inputs belong. Each of the subsets has $2^{k-m}$ elements and the minimum Hamming distance between any of the $2^{k-m}$ elements is equal to or greater than the Hamming distance to be achieved by the encoder. The convolutional encoder is responsive to the k-bit (input and the m-bit output of the converter to generate an (n-k)-bit output, where n is greater than k.

BRIEF DESCRIPTION OF THE DRAWINGS

The present invention will be described in further detail with reference to the accompanying drawings, in which.

DETAILED DESCRIPTION

Figure 1:
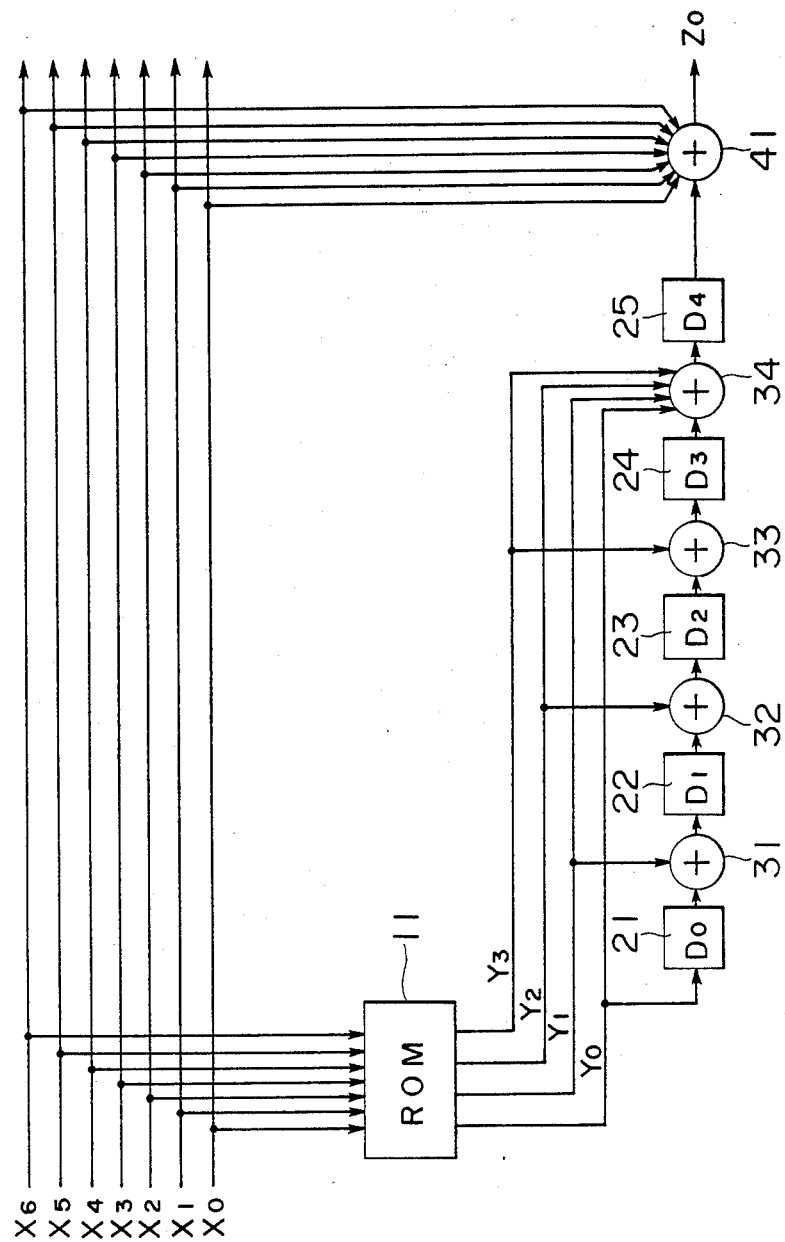
FIG. 1 is a block diagram of a convolutional encoder of the present invention.

In FIG. 1, a rate k/n convolutional encoder having a minimum Hamming distance r constructed according to the present invention comprises a read-only memory 11, delay elements 21 through 25, modulo 2 adders 31 through 34 and 41 (where k, n and k are 7, 8 and 4, respectively). Read-only memory 11 converts k-bit inputs to m-bits outputs (where m is smaller than k) and defines the exhaustive and distinctive partitioning of a set of $2^k$ elements into $2^m$ subsets each containing an equal number of $2^{k-m}$ elements, wherein each element correspond to any one of the possible k-bit inputs. The m-bit outputs represent the subset to which the k-bit inputs belong. In each subset the Hamming distance between any two elements in the set is equal to or greater than the Hamming distance to be achieved. More specifically, read-only memory 11 translates a 7-bit parallel input (X6, X5, ... X0) into a 4-bit parallel output (Y3, Y2, Y1, Y0) which represents one of 2"hu 4 subsets of a set of $2^7$ elements, or information symbols and the 7-bit input data belongs to the subset represented by the 4-bit output. Each subset is composed of $2^3$ symbols and the Hamming distance between any of its symbols is not smaller than the minimum Hamming distance of 4. Since the $2^k$ possible inputs which can be taken by the k-bit input are divided into $2^m$ subsets, any k-bit inputs that belong to the same subset merge into $2^{k-m}$ "parallel transitions" which are bundled into one of $2^m$ possible state transitions which the encoder is required to take. The number of state transitions can therefore be reduced in comparison with the prior art.

The delay elements 21 through 25 constitute a memory circuit which stores the current state (D4, D3, D2, D1, D0) of the convolutional encoder. Modulo 2 adders 31 through 34 receive the outputs of read-only memory 11 and the outputs of delay elements 21 through 25 and deterine the next state of the convolutional encoder. More specifically, delay element 21 receives the Y0 output of memory 11 to introduce a unit delay time to it and applies it to modulo 2 adder 31 where it is modulo 2 summed with the Y1 output of memory 11. The output of modulo 2 adder 31 is delayed a unit time by delay element 22 and modulo 2 summed by modulo 2 adder 32 with the Y2 output of memory 11. Likewise, modulo 2 adder 33 performs modulo 2 addition on the Y3 output of memory 11 and the output of delay element 23 which introduces a unit delay time to the output of modulo 2 adder 32. The output of modulo 2 adder 33 is delayed by unit time by delay element 24 and supplied to modulo 2 adder 34 to which all the outputs of memory 11 are also applied. Delay element 25 introduces a unit delay time to the output of modulo 2 adder 34 and supplies its output to modulo 2 adder 41 to which the data inputs X0 through X6 are also applied. Modulo 2 adder 41 produces a 1-bit (=n−k) output Zo.

The above mentioned partitioning of a set of $2^k$ elements can also be achieved in the following manner. Since a subset $V_0$ can be represented by (7, 3) equidistant code with a Hamming distance of 4, or a dual code of (7, 4) Hamming code as follows:

$V_0 = \{0000000, 0001111, 0110011, 0111100,$
$\quad 1010101, 1011010, 1100110, 1101001\}$ Evidently, the Hamming distance between any of two elements in this subset is four. Since subset $V_O$ is composed of 8 elements, a total of 16 such subsets should be formed to completely define the partitioning. This can effectively be done by the coset decompositioning because the set of $2^k$ elements is actually a group and its subset $V_0$ is actually its subgroup as described in "Error-Correcting Codes" by W. Wesley Peterson and E. J. Weldon, Jr., 1972, The M1T Press, pages 25 to 28. Specifically, subset $V_1$ is obtained by performing bitwise modulo 2 additions of 0000001 (the element which is not contained in $V_0$) to each element of $V_0$. Using decimal numbers, subsets $V_0$ through $V_{15}$ can be given as follows:

$V_0 = \{0, 15, 51, 60, 85, 90, 102, 105\}$
$V_1 = \{1, 14, 50, 61, 84, 91, 103, 104\}$
$V_2 = \{2, 13, 49, 62, 87, 88, 100, 107\}$
$V_3 = \{3, 12, 48, 63, 86, 89, 101, 106\}$
$V_4 = \{4, 11, 55, 56, 81, 94, 98, 109\}$
$V_5 = \{5, 10, 54, 57, 80, 95, 99, 108\}$
$V_6 = \{6, 9, 53, 58, 83, 92, 96, 111\}$
$V_7 = \{7, 8, 52, 59, 82, 93, 97, 110\}$
$V_8 = \{16, 31, 35, 44, 69, 74, 118, 121\}$
$V_9 = \{17, 30, 34, 45, 68, 75, 119, 120\}$
$V_{10} = \{18, 29, 33, 46, 71, 72, 116, 123\}$
$V_{11} = \{19, 28, 32, 47, 70, 73, 117, 122\}$
$V_{12} = \{20, 27, 39, 40, 65, 78, 114, 125\}$
$V_{13} = \{21, 26, 38, 41, 64, 79, 115, 124\}$
$V_{14} = \{22, 25, 37, 42, 67, 76, 112, 127\}$
$V_{15} = \{23, 24, 36, 43, 66, 77, 113, 126\}$

It can be proved that in any of the above subsets the Hamming distance between any of two arbitrary elements is 4.

Figure 2:
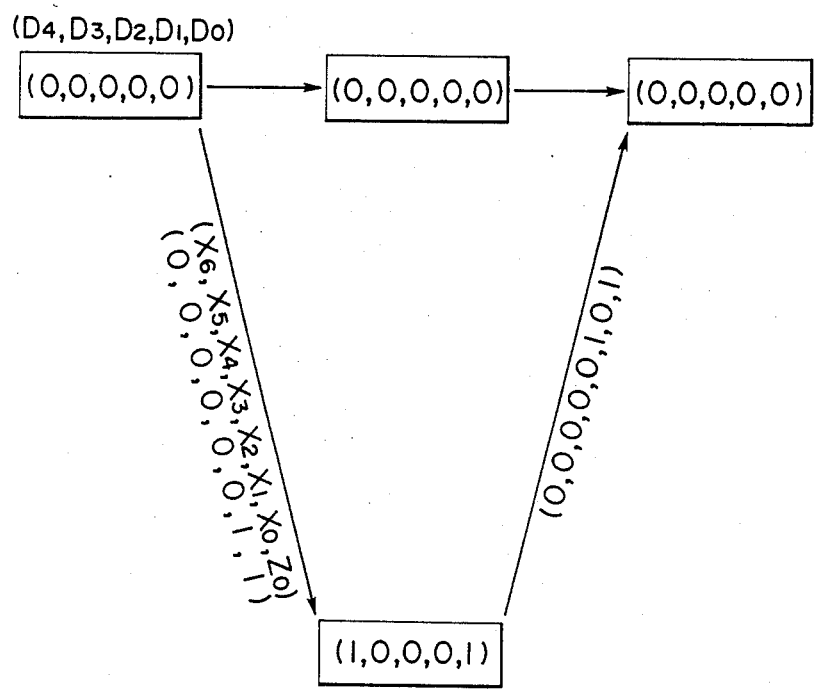
FIG. 2 is an illustration of minimum Hamming distances between symbols.

The minimum Hamming distance between two valid output sequences of the convolutional encoder can be evaluated as follows. A 7-bit wide input sequence applied to the encoder results in the generation of an 8-bit wide output sequence. If two 7-bit wide input codewords both fall into the same subset simultaneously, the encoder will have exactly the same state transition. However, in that case the Hamming distance between the two input codes and hence the two output codewords is as large as four. If two 7-bit wide input codewords do not fall into the same subset, the encoder will have different state transitions. In this case, the Hamming distance between the input codewords may be as small as one, but the Hamming distance between output sequences can be larger than one since additional distance can be obtaind before the two output sequences merge into the same state. FIG. 2 shows two such sequences with the Hamming distance of four. By inspection, it is seen that no two sequences with the Hamming distance smaller than four can exist. A rate ⅞ convolutional encoder can therefore be realized with a minimum intersymbol Hamming distance of four despite the fact that the number of possible states that can be taken by the encoder is kept as small as 32.

What is claimed is:

1. An encoding apparatus comprising:
   converter means for converting a k-bit input to an m-bit output, said k-bit input belonging to one of $2^m$ subsets of a set of $2^k$ elements, said m-bit output representing said one of $2^m$ subsets, each of said subsets having $2^{kp-m}$ elements, the minimum Hamming distance between any of said $2^{k-m}$ elements being equal to or greater than a Hamming distance to be achieved, where m is smaller than k; and
   a convolutional encoder having the last-mentioned Hamming distance and responsive to said k-bit input and said m-bit output for generating an (n−k)-bit output, where n is greater than k.

2. An encoding apparatus as claimed in claim 1, wherein said convolutional encoder comprises:
   first means connected to said converter for storing the current state of the encoder;
   second means for responsive to the output of said converter means and the output of said first means for generating a signal representative of a subsequent state of said encoder; and
   third means responsive to the output of said first means and to said k-bit input for generating said (n−k)-bit output.

* * * * *